US007907034B2

(12) United States Patent
Taniguchi (10) Patent No.: US 7,907,034 B2
(45) Date of Patent: Mar. 15, 2011

(54) LAMINATED BAND-PASS FILTER HAVING AN EVEN NUMBER OF LC PARALLEL RESONATORS

(75) Inventor: Tetsuo Taniguchi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/606,334

(22) Filed: Oct. 27, 2009

(65) Prior Publication Data

US 2010/0039189 A1  Feb. 18, 2010

Related U.S. Application Data

(63) Continuation of application No. PCT/JP2008/058800, filed on May 14, 2008.

(30) Foreign Application Priority Data

May 18, 2007  (JP) ................................. 2007-132935

(51) Int. Cl.
H03H 7/00  (2006.01)
(52) U.S. Cl. .......................... 333/185; 333/168; 333/175
(58) Field of Classification Search .................. 333/132, 333/134, 167, 168, 172, 175, 177, 185
See application file for complete search history.

(56) References Cited

U.S. PATENT DOCUMENTS

| 4,418,324 | A | 11/1983 | Higgins | |
|---|---|---|---|---|
| 6,759,926 | B2 * | 7/2004 | Yamaguchi | 333/175 |
| 6,914,500 | B2 * | 7/2005 | Hirabayashi | 333/204 |
| 7,671,706 | B2 * | 3/2010 | Taniguchi | 333/203 |
| 2001/0050601 | A1 | 12/2001 | Yano | |
| 2002/0030561 | A1 | 3/2002 | Masuda et al. | |
| 2003/0048156 | A1 | 3/2003 | Uriu et al. | |
| 2004/0085164 | A1 | 5/2004 | Hirabayashi | |

FOREIGN PATENT DOCUMENTS

| DE | 10 2006 023 431 A1 | 11/2006 |
|---|---|---|
| EP | 1 162 738 A2 | 12/2001 |
| EP | 1 265 311 A2 | 12/2002 |
| JP | 3-262313 A | 11/1991 |
| JP | 4-6911 A | 1/1992 |
| JP | 6-164289 A | 6/1994 |
| JP | 10-256806 A | 9/1998 |

(Continued)

OTHER PUBLICATIONS

Official Communication issued in International Patent Application No. PCT/JP2008/058800, mailed on Aug. 19, 2008.
Official Communication issued in corresponding European Patent Application No. 0875261.1, mailed on Jun. 18, 2010.
Tang et al., "Laminated Ceramic Interdigital Bandpass Filter", Microwave Conference Proceedings, Dec. 4, 2005, vol. 55, pp. 1-3.

(Continued)

*Primary Examiner* — Robert Pascal
*Assistant Examiner* — Kimberly E Glenn
(74) *Attorney, Agent, or Firm* — Keating & Bennett, LLP (57) ABSTRACT

In a laminated band-pass filter, a capacitance is formed between a ground electrode of a ground electrode formation layer and each of capacitor electrodes of capacitor electrode formation layers. An even number of LC parallel resonators is arranged such that via electrodes and line electrodes define a plurality of inductor electrodes and, when viewed in a direction in which the inductor electrodes are arranged, the surfaces of the loops of the inductor electrodes overlap each other at least partially. The loops defined by the inductor electrodes of neighboring LC parallel resonators have opposite directions. The capacitor electrodes have a shape and distribution or arrangement having point symmetry in plan view.

6 Claims, 4 Drawing Sheets

FOREIGN PATENT DOCUMENTS

| | | |
|---|---|---|
| JP | 2000-201001 A | 7/2000 |
| JP | 2001-352224 A | 12/2001 |
| JP | 2003-198226 A | 7/2003 |
| JP | 2006-197214 A | 7/2006 |
| WO | 02/09225 A1 | 1/2002 |

OTHER PUBLICATIONS

Baabuei et al., "The Application of Wideband Microstrip Interdigital Filters in Microwave Circuits", Microwave Conference Proceedings, Dec. 4, 2005, vol. 1, oo. 1-4.

* cited by examiner

LAMINATED BAND-PASS FILTER HAVING AN EVEN NUMBER OF LC PARALLEL RESONATORS

BACKGROUND OF THE INVENTION

1. Field of the Invention

The present invention relates to a laminated band-pass filter in which a plurality of dielectric layers and electrode layers are laminated.

2. Description of the Related Art

A traditional high-frequency band-pass filter suited for reducing its size and cost is one in which a plurality of LC resonators is disposed in a laminated structure of dielectric layers and electrode layers. Examples of such a laminated band-pass filter are disclosed in Japanese Unexamined Patent Application Publication No. 4-6911, Japanese Unexamined Patent Application Publication No. 2000-201001, Japanese Unexamined Patent Application Publication No. 2003-198226, and International Publication No. WO 02/009225

Figure 1A:
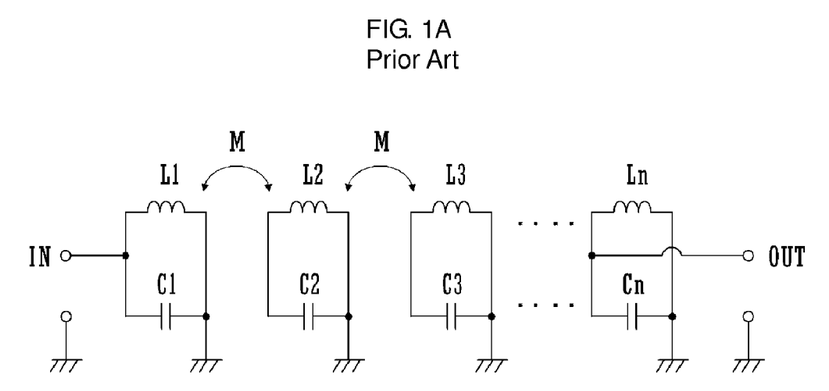
FIGS. 1A and 1B are equivalent circuit diagrams and a cross-sectional view of a laminated band-pass filter illustrated in Japanese Unexamined Patent Application Publication No. 4-6911.
Figure 1B:
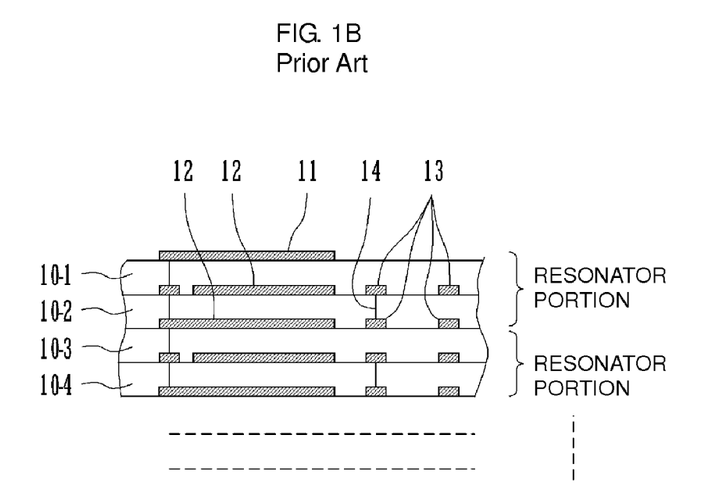

The configuration of the laminated band-pass filter in Japanese Unexamined Patent Application Publication No. 4-6911 is described with reference to FIGS. 1A and 1B. FIG. 1A is a circuit diagram thereof, and FIG. 1B is a cross-sectional view thereof. In the filter, a plurality of LC parallel resonant circuits are inductively coupled (magnetically coupled). Inductors L1, L2, L3, . . . , and Ln and capacitors C1, C2, C3, . . . , and Cn form a plurality of parallel resonators, and the inductors of neighboring resonators are magnetically coupled.

As illustrated in FIG. 1B, a capacitor electrode pattern 12 and an inductor pattern 13 are formed by printing in each of a first layer 10-1, a second layer 10-2, and a third layer 10-3, and these layers form resonators. That is, a capacitor is formed between a ground electrode 11 and the capacitor electrode 12, and the inductor patterns 13 of two layers are electrically connected to each other via a blind through hole 14. A plurality of layers forming such resonators are laminated as a fourth layer 10-4 and its underlying layers, thus magnetically coupling neighboring inductors.

Japanese Unexamined Patent Application Publication No. 2000-201001 describes a laminated band-pass filter in which a plurality of LC resonators is disposed inside a laminated structure of dielectric layers and electrode layers. The plurality of LC resonators are made up of a plurality of capacitances formed by a plurality of capacitance forming electrodes and inductances included in the plurality of capacitance forming electrodes. The neighboring LC resonators of the LC resonators are disposed inside the laminate structure at different height positions in the thickness direction of the laminated structure and electromagnetically coupled. The arrangement in which the plurality of LC resonators are disposed in the laminated structure at different height positions in the thickness directions of the laminated structure can reduce the part size while a physical distance between the LC resonators that is necessary in the design of a band-pass filter is maintained.

The laminated band-pass filter in Japanese Unexamined Patent Application Publication No. 2003-198226 includes a filter element in which first and second filter lines each including a pair of parallel lines disposed in part of a wiring layer are opposed to different circuit layers and are electrically connected at one end and the pair of lines is folded through a dielectric layer.

The laminated band-pass filter in International Publication No. WO 02/009225 includes two strip lines forming a resonator and disposed in the same layer at a specified interval and thereby electromagnetically coupled.

For the laminated band-pass filter of Japanese Unexamined Patent Application Publication No. 4-6911, the inductor included in each of the LC parallel resonators is made up of a two-layer inductor pattern, so a problem arises in which magnetic coupling between the LC parallel resonators is large. The inductor made up of the two-layer inductor pattern causes a problem in which a decrease in the Q value of the inductor increases the insertion loss of the laminated band-pass filter. To solve the above problems, it is necessary to have a sufficiently long distance between the LC parallel resonators. This results in a problem in which the thickness of the laminated band-pass filter is large.

The laminated band-pass filter of Japanese Unexamined Patent Application Publication No. 2000-201001 uses self resonance of the capacitor. The capacitance component of each of the capacitor electrodes and the inductance component of the capacitor electrode form an LC resonator. Because of this, the resonator cannot have a desired inductance, and characteristics of low insertion loss of the laminated band-pass filter are unobtainable.

The laminated band-pass filter of each of Japanese Unexamined Patent Application Publication No. 2003-198226 and International Publication No. WO 02/009225 can achieve a small size and low insertion loss. However, if a multilayer resonator is used to achieve sharp attenuation characteristics from a passband to a range outside the passband, two-stage filters are laminated in the direction of the lamination and strip lines are coupled in the direction of the thickness. This results in a problem in which the multilayer filter has a large thickness.

For these traditional laminated band-pass filters, when an LC parallel resonator made up of a capacitor electrode and an inductor electrode is arranged in a laminated structure and neighboring inductor electrodes are inductively coupled, there is a problem in which a ripple (deviation) occurs in passband characteristics.

SUMMARY OF THE INVENTION

In view of the above problems, preferred embodiments of the present invention provide a small-sized and low-loss laminated band-pass filter that has stable passband characteristics having sharp attenuation from a passband to a range outside the passband.

A laminated band-pass filter according to a preferred embodiment of the present invention includes, as an element assembly, a laminated structure including a plurality of dielectric layers and a plurality of electrode layers, the plurality of electrode layers each having a capacitor electrode and/or an inductor electrode. The capacitor electrodes and the inductor electrodes define an even number of LC parallel resonators including neighboring LC parallel resonators being coupled. The laminated band-pass filter further includes an input electrode connected to an input-side LC parallel resonator of the even number of LC parallel resonators and an output electrode connected to an output-side LC parallel resonator of the even number of LC parallel resonators. The inductor electrode of each of the even number of LC parallel resonators defines a loop starting from a connection between a first end of the inductor electrode and the capacitor electrode. When viewed in a direction in which the inductor electrodes are arranged, surfaces of the loops defined by the inductor electrodes of coupling LC parallel resonators of the LC parallel resonators overlap each other at least partially. When viewed in the direction in which the inductor electrodes are arranged, the loops defined by the inductor electrodes of at least two of the coupling LC parallel resonators have opposite directions. The capacitor electrodes of the even number of LC parallel resonators have a shape and distribution having point symmetry in plan view.

The inductor electrodes, the input electrode, and the output electrode preferably have a shape and distribution (arrangement) having point symmetry in plan view (when the center of symmetry is a common point in plan), as well as the capacitor electrodes.

The loops defined by the inductor electrodes of the neighboring LC parallel resonators preferably have opposite directions.

Each of the inductor electrodes preferably is coiled and includes a via electrode disposed in a direction in which the dielectric layers are laminated and a line electrode at least disposed along a direction perpendicular or substantially perpendicular to the direction in which the dielectric layers are laminated. The inductor electrodes and the capacitor electrodes are arranged in a direction perpendicular or substantially perpendicular to the direction in which the dielectric layers and the electrode layers are laminated.

Each of the capacitor electrodes forms a capacitance between the capacitor electrode and a common ground electrode extending over an area where the capacitor electrodes are arranged, and the capacitor electrodes are disposed in the same electrode layer.

Each of the capacitor electrodes forms a capacitance between the capacitor electrode and a common ground electrode extending over an area where the capacitor electrodes are arranged, and the capacitor electrodes sandwich the ground electrode in a thickness direction and are disposed on opposite sides of the ground electrode.

With various preferred embodiments of the present invention, the following advantages are achievable.

Because each of the inductor electrodes for even number of LC parallel resonators defines the loop and, when viewed from the direction in which the inductor electrodes are arranged, the surfaces of the loops defined by the inductor electrodes of the coupling LC parallel resonators overlap each other at least partially, the degree of coupling (inductive coupling) between neighboring LC parallel resonators can be increased and the pass band can be widened.

Because the inductor electrode can be provided separately from the capacitor electrode, the inductor can have a high Q value and the insertion loss can be reduced.

Because the resonator does not use self resonance, the resonator can have a desired inductance and a reduction in the insertion loss can be achieved in a desired passband.

Because the loops formed by the inductor electrodes of neighboring LC parallel resonators have opposite directions, a ripple of insertion loss in passband can be prevented and satisfactory passband characteristics are obtainable.

In addition, the input and the output have substantially the same impedance characteristics (reflection characteristics), so the passband characteristics of the filter can be stable.

The configuration in which the inductor electrodes, the input electrode, and the output electrode have a shape and distribution (arrangement) having point symmetry in plan view, as well as the capacitor electrodes, further facilitates the sameness of the impedance characteristics (reflection characteristics) of the input and that of the output. Accordingly, the laminated band-pass filter can be used as a non-directional band-pass filter.

The relationship of the opposite directions of the loops defined by the inductor electrodes of neighboring LC parallel resonators enables a design in which an attenuation pole is present in bands lower and higher than the passband. This eliminates the necessity of a capacitor between input and output to design a sufficient amount of attenuation in lower bands. Accordingly, there is no need to have a structure in which capacitor electrodes defining input/output resonators are neighboring and a structure in which an electrode connecting between input and output capacitors is disposed, and thus variations in characteristics resulting from inaccuracies in forming these electrode patterns do not occur. Accordingly, a stable characterized band-pass filter having high attenuation characteristics is obtainable.

The arrangement in which the inductor electrodes and the capacitor electrodes of the LC parallel resonators are arranged in a direction perpendicular or substantially perpendicular to the direction in which the dielectric layers and the electrode layers are laminated can make the gap between the surfaces of the loops formed by neighboring inductor electrodes constant. Accordingly, even if a shift occurs in a surface direction of each of the dielectric layers and the electrode layers during lamination, the shift between the inductor electrodes of neighboring LC parallel resonators can be virtually eliminated. Thus, the band-pass filter characteristics whose variations are reduced are obtainable.

In the LC parallel resonator, the capacitor electrodes are arranged to form a capacitance between the common ground electrode extending over the area of the capacitor electrodes, and the neighboring capacitor electrodes produce a capacitance between each other, too. Thus, a capacitive element for coupling in a LC parallel resonance period, which is traditionally required as an independent element, can be omitted, and the Q value of the resonator can be improved. Even if a shift occurs in a layer where a capacitor electrode is disposed during lamination or printing, there is no change in a capacitance between the capacitor electrode and the ground electrode and in a capacitance between the neighboring capacitor electrodes, so variations that would be caused by such a change can be prevented.

Arranging the capacitor electrodes of the LC parallel resonators so as to sandwich the ground electrode in the thickness direction and be disposed on opposite sides of the ground electrode enables a capacitor for coupling between neighboring LC parallel resonators and a capacitor for jump coupling between distant LC parallel resonators to be disposed in a limited area, and this results in a reduction in the whole size.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

First Preferred Embodiment

A laminated band-pass filter according to a first preferred embodiment is described with reference to FIGS. 2-5.

Figure 2:
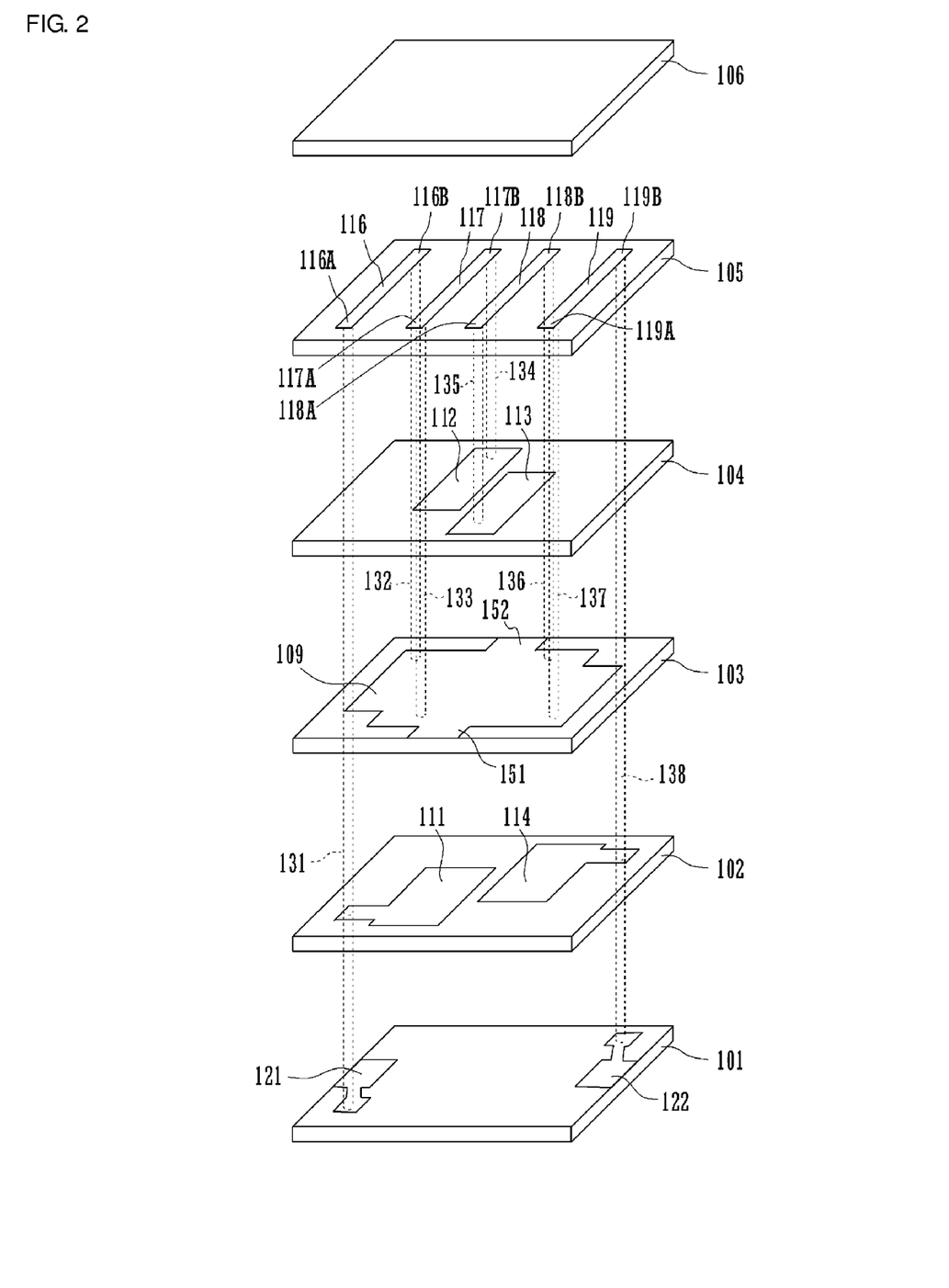
FIG. 2 is an exploded perspective view of a laminated band-pass filter according to a first preferred embodiment of the present invention.
Figure 3:
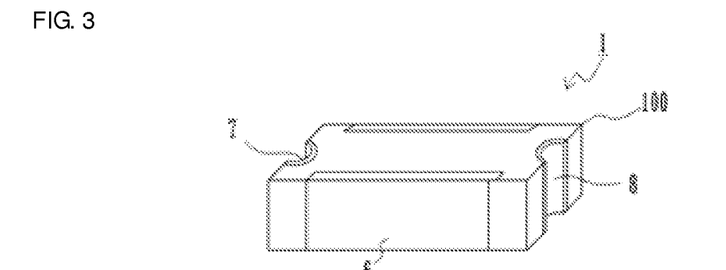
FIG. 3 is an external perspective view of the laminated band-pass filter.

FIG. 2 is an exploded perspective view of a laminated band-pass filter according to the first preferred embodiment, and FIG. 3 is an external perspective view thereof.

In FIG. 2, a ground electrode 109 is disposed on the upper surface of a ground electrode formation layer 103. Capacitor electrodes 111 and 114 are disposed in a capacitor electrode formation layer 102. Capacitor electrodes 112 and 113 are disposed in a capacitor electrode formation layer 104. Input/output electrodes 121 and 122 are disposed in an input/output electrode formation layer 101. Line electrodes 116 to 119 are disposed in a line electrode formation layer 105. An external layer 106 is disposed above the line electrode formation layer 105. The laminated band-pass filter has a laminated structure preferably including six dielectric layers and five electrode layers and having terminal electrodes disposed on end surfaces, for example.

In FIG. 3, a laminated structure 100 is the above laminated structure including the dielectric layers and electrode layers. Input/output terminals 7 and 8 are disposed on two side surfaces (end surfaces) opposing each other of four side surfaces of the laminated structure 100, and a ground terminal 6 is disposed on the remaining two side surfaces. In this way, a laminated band-pass filter 1 is configured. The laminated structure 100 preferably has a size of about 1.6 mm×about 0.8 mm and a height of about 0.5 mm, for example.

The dielectric-layer portion of each layer is preferably made of low temperature co-fired ceramics (LTCC) having a relative dielectric constant ∈r=53.5. As the dielectric layer, a material having a relative dielectric constant in the range from 6 to 80 can be used.

The electrode layer containing the line electrodes and the dielectric layer laminated thereon, that is, the line electrode formation layer 105 and external layer 106 have a relative dielectric constant in the range from 6 to 80. The relative dielectric constant of the capacitor electrode formation layers is equal to or larger than 20. Each of the dielectric layers can be made of, for example, low temperature co-fired ceramics made of a glass component and at least one component of titanium oxide, barium oxide, and alumina. The above-described material of which each dielectric layer is made is also applicable to that in another preferred embodiment described below.

In FIG. 2, the ground electrode 109 extending over an area slightly smaller than the plane external shape of the ground electrode formation layer 103 and ground connection electrodes 151 and 152 are disposed in the ground electrode formation layer 103. The ground connection electrodes 151 and 152 are electrically connected to the ground electrode 109 and extend to two side surfaces of the ground electrode formation layer 103. The two ground connection electrodes 151 and 152 are electrically connected to the ground terminal 6, which is illustrated in FIG. 3.

The capacitor electrodes 111 and 114 disposed in the capacitor electrode formation layer 102 preferably are substantially rectangular and parallel to each other. The capacitor electrodes 112 and 113 disposed in the capacitor electrode formation layer 104 preferably are substantially rectangular and parallel to each other. A capacitance is formed between the ground electrode 109 and each of these capacitor electrodes 111 to 114. A capacitance is also formed between the neighboring capacitor electrodes.

The input/output electrodes 121 and 122 disposed in the input/output electrode formation layer 101 are in contact with the two shorter sides thereof and substantially rectangular. The two input/output electrodes 121 and 122 are electrically connected to the input/output terminals 7 and 8, respectively, which are illustrated in FIG. 3.

The line electrodes 116 to 119 disposed in the line electrode formation layer 105 are parallel or substantially parallel to one another and have a linear shape.

Via electrodes 131 to 138 are disposed in the input/output electrode formation layer 101, the capacitor electrode formation layers 102 and 104, the ground electrode formation layer 103, and the line electrode formation layer 105. The via electrodes 131 to 138 extend along the direction of the lamination of these layers. The via electrode 131 is electrically connected to a first end 116A of the line electrode 116, the capacitor electrode 111, and the input/output electrode 121. The via electrode 132 is electrically connected to a second end 1116B of the line electrode 116 and the ground electrode 109. The via electrode 133 is electrically connected to a first end 117A of the line electrode 117 and the ground electrode 109. The via electrode 134 is electrically connected to a second end 117B of the line electrode 117 and the capacitor electrode 112. The via electrode 135 is electrically connected to a first end 118A of the line electrode 118 and the capacitor electrode 113. The via electrode 136 is electrically connected to a second end 118B of the line electrode 118 and the ground electrode 109. The via electrode 137 is electrically connected to a first end 119A of the line electrode 119 and the ground electrode 109. The via electrode 138 is electrically connected to a second end 119B of the line electrode 119, the capacitor electrode 114, and the input/output electrode 122.

Accordingly, the inductor electrodes made up of the via electrodes and line electrodes and the directions of the loops thereof have a relationship described below.

TABLE 1

| Inductor Electrode | Via Electrode | Line electrode | Loop Direction |
|---|---|---|---|
| First | 131, 132 | 116 | 1 |
| Second | 133, 134 | 117 | 0 |
| Third | 135, 136 | 118 | 1 |
| Fourth | 137, 138 | 119 | 0 |

A "loop" defined by an inductor electrode is formed by a path of the inductor electrode starting from a connection between a capacitor electrode and the inductor electrode. That is, a loop starts from a connection between a capacitor electrode and a via electrode and is defined by a connection path of the via electrode, a line electrode, and another via electrode.

A "loop direction" is the direction in which a loop is wound from the starting point of the loop viewed from one direction of the direction in which the line electrodes are arranged. For example, when, in FIG. 2, the loops defined by the inductor electrodes are viewed from the input/output electrode 121 toward the input/output electrode 122, a first inductor electrode defines a loop of the connection path from the connection (starting point) between the capacitor electrode 111 and the via electrode 131 to the via electrode 131 to the line electrode 116 to the via electrode 132. The loop direction of the first inductor electrode is left-handed. A second inductor electrode defines a loop of the connection path from the connection (starting point) between the capacitor electrode 112 and the via electrode 134 to the via electrode 134 to the line electrode 117 to the via electrode 133. The loop direction of the second inductor electrode is right-handed. Here, a loop can have only two directions of left-handed and right-handed; one direction is represented by "1" and the other is represented by "0."

In such a way, in a laminated structure made up of a plurality of dielectric layers and a plurality of electrode layers each including at least one of a capacitor electrode and an inductor electrode, an even number of LC parallel resonators including neighboring LC parallel resonators being coupled using a capacitor electrode and an inductor electrode, are provided.

The polarities of coupling between the four (four-stage) LC parallel resonators shown in Table 1 can be represented as <1010> when expressed in sequence from the input side to the output side of the band-pass filter.

As described above, the laminated band-pass filter illustrated in the present preferred embodiment has a characteristic configuration described below.

The shape and distribution (arrangement) of the capacitor electrodes 111 to 114 of an even number of LC parallel resonators have point symmetry in plan view.

The shape and distribution (arrangement) of the inductor electrodes made up of the via electrodes 131 to 138 and the line electrodes 116 to 119 and the input/output electrodes 121 and 122, as well as the capacitor electrodes 111 to 114, have point symmetry in plan view with respect to the center of the dielectric layer.

The inductor electrodes of neighboring LC parallel resonators have opposite loop directions.

In the inductor electrodes, the inductor electrodes made up of the via electrodes 131 to 138 extending in the direction in which the dielectric layers are laminated and the line electrodes 116 to 119 extending at least perpendicular or substantially perpendicular to the direction in which the dielectric layers are laminated are coiled. The inductor electrodes and capacitor electrodes are arranged perpendicular or substantially perpendicular to the direction in which the dielectric layers and the electrode layers are arranged.

A capacitance is formed between the common ground electrode 109, which extends over the area where the plurality of capacitor electrodes 111 to 114 are arranged, and each of these capacitor electrodes. The capacitor electrodes 111 and 114 are disposed in the same electrode layer, and the capacitor electrodes 112 and 113 are disposed in the same electrode layer.

Each of the capacitor electrodes is an electrode that forms a capacitance between the electrode and the ground electrode 109, which extends over the area where the plurality of capacitor electrodes 111 to 114 are arranged. The capacitor electrodes 111 to 114 sandwich the ground electrode 109 in the direction of the thickness and are disposed on the opposite sides of the ground electrode 109.

The via electrode 131 connecting to the capacitor electrode 111 and the via electrode 138 connecting to the capacitor electrode 114, the capacitor electrodes 111 and 114 being included in the LC parallel resonators of the input stage and the output stage, are neighboring to the via electrodes 133 and 136, respectively, which are included in the neighboring LC parallel resonators and connect to the ground electrode 109.

Figure 4:
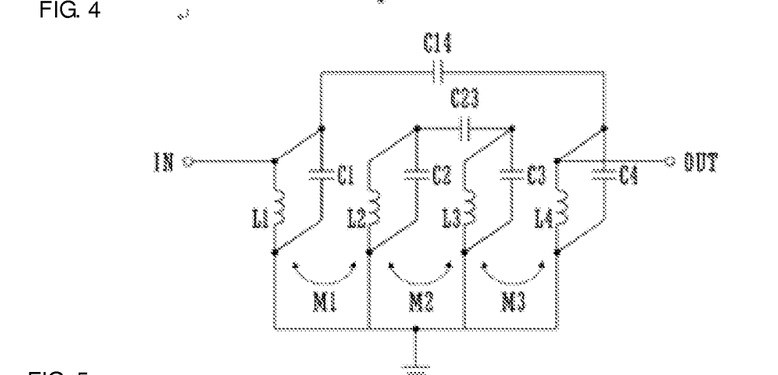
FIG. 4 is an equivalent circuit diagram of the laminated band-pass filter.

FIG. 4 is an equivalent circuit diagram of the above-described laminated band-pass filter.

In FIG. 4, an input terminal IN corresponds to the input/output terminal 7, which is illustrated in FIG. 3 and electrically connected to the input/output electrode 121 illustrated in FIG. 2, and an output terminal OUT corresponds to the input/output terminal 8, which is electrically connected to the input/output electrode 122. An inductor L1 is defined by an inductance produced by the inductor electrode made up of the via electrodes 131 and 132 and the line electrode 116. An inductor L2 is defined by an inductance produced by the inductor electrode made up of the via electrodes 133 and 134 and the line electrode 117. Similarly, an inductor L3 is defined by an inductance produced by the inductor electrode made up of the via electrodes 135 and 136 and the line electrode 118. An inductor L4 is defined by an inductance produced by the inductor electrode made up of the via electrodes 137 and 138 and the line electrode 119.

Capacitors C1 to C4 are defined by capacitances occurring between the capacitor electrodes 111 to 114 and the ground electrode 109. A capacitor C23 is defined by a parasitic capacitance occurring between the capacitor electrodes 112 and 113 and contributes to the capacitive coupling between the second-stage and third-stage LC parallel resonators. Similarly, a capacitor C14 is defined by a parasitic capacitance occurring between the capacitor electrodes 111 and 114 and contributes to the jump coupling between the first-stage and fourth-stage LC parallel resonators.

When viewed from the direction of the arrangement of the inductor electrodes, the loop surfaces defined by the inductor electrodes each made up of two via electrodes and one line electrode overlap each other at least partially. Thus, at least inductors defined by neighboring inductor electrodes are inductively coupled to each other.

In FIG. 4, M1 represents an inductive coupling defined by the inductors L1 and L2, M2 represents an inductive coupling defined by the inductors L2 and L3, and M3 represents an inductive coupling defined by the inductors L3 and L4.

Figure 5:
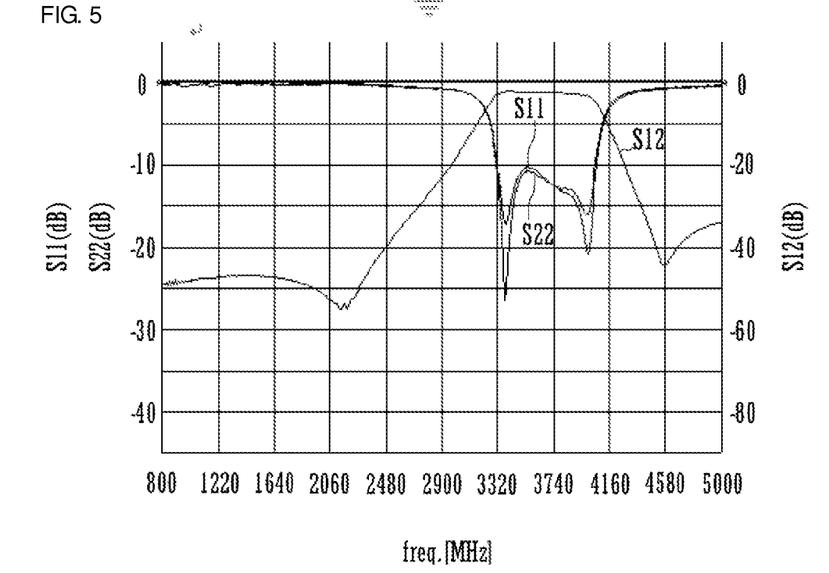
FIG. 5 illustrates passband characteristics and reflection characteristics of the laminated band-pass filter.

FIG. 5 illustrates passband characteristics (S21 characteristics for S parameter) and reflection characteristics (S11 characteristics and S22 characteristics for S parameter) of the above-described laminated band-pass filter.

As illustrated in FIG. 5, in this example, the band-pass filter characteristics of allowing the passage in the frequency band from about 3.3 GHz to about 4.0 GHz and blocking the passage in the other frequency bands are obtainable. At about 2.2 GHz and about 4.5 GHz, an attenuation pole occurs. A large amount of the attenuation in the vicinity of the attenuation pole is achieved. The attenuation pole is caused by inductive coupling of an even number of LC parallel resonators in opposite polarities in an alternating manner.

The reflection characteristic S11 of the input/output terminal 7 and the reflection characteristic S12 of the input/output terminal 8 are substantially the same. Thus, there are few ripples, and the obtained characteristic is stable. In addition, there is not much difference between the impedance characteristic (reflection characteristic) of the input and those of the output, so the laminated band-pass filter can be used as a band-pass filter having non-directional input/output terminals.

With the first preferred embodiment, unlike traditional laminated band-pass filters, LC parallel resonators including U-shaped inductors rotated 90° defined by the via electrodes and line electrodes are arranged transversely. Accordingly, the low-loss passband characteristic is obtainable.

The arrangement in which the via electrode 131 connecting to the capacitor electrode 111 and the via electrode 138 connecting to the capacitor electrode 114, the capacitor electrodes 111 and 114 being included in the LC parallel resonators of the input stage and the output stage, are neighboring to the via electrodes 133 and 136, respectively, which are included in the neighboring LC parallel resonators and connect to the ground electrode 109, enables optimal electromagnetic coupling and can achieve a small size and low profile of the laminated structure. Because the capacitor electrodes 111 and 114 and the capacitor electrodes 112 and 113 are separately disposed in the opposite layers sandwiching the ground electrode 109, coupling produced by an unnecessary capacitance component between predetermined neighboring LC parallel resonators (capacitive coupling between the first and second stages and capacitive coupling between the third and fourth stages) can be prevented. Because the capacitor electrodes (111, 114) for jump coupling can be disposed in a single layer, even if there is a shift in printing or laminating, the laminated structure is not affected by the shift and variations in capacitance for jump coupling can be prevented.

Because of the configuration in which the line electrodes 116 to 119, the capacitor electrodes 111 to 114, and the ground electrode 109 are connected with the via electrodes 131 to 138, even if there is a shift in cutting or laminating dielectric sheets, the laminated structure is not affected by the shift, and this results in reduced variations in resonant frequency. Also for the capacitor electrodes 111 and 114, which are connected to the input/output electrodes 121 and 122, respectively, because they are connected in different layers through the via electrodes 131 and 138, even if there is a shift in printing or laminating, the laminated structure is not affected by the shift. Accordingly, variations in capacitance can be prevented.

In addition, because of a designed point symmetric configuration, impedance characteristics from input and output are substantially the same. Therefore, stable passband characteristics are obtainable.

The configuration in which all of the loop directions of the inductor electrodes of neighboring LC parallel resonators have opposite <1010> relationship allows an attenuation pole to be designed in both of lower and higher bands than the passband in design. This eliminates the necessity of a capacitor for coupling between input and output to achieve a necessary amount of attenuation in lower bands. Accordingly, variations in parasitic capacitance between capacitor electrodes can be prevented, and a stable characterized band-pass filter having high attenuation characteristics is obtainable.

Second Preferred Embodiment

Figure 6:
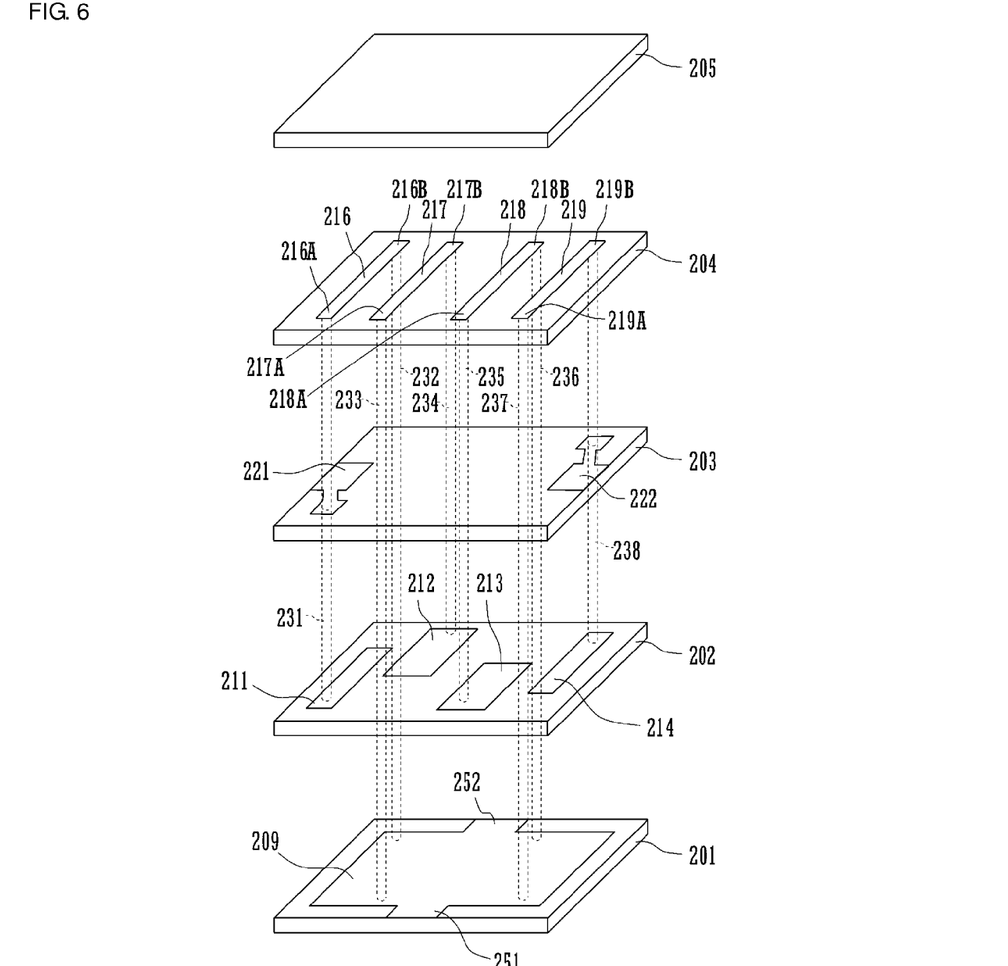
FIG. 6 is an exploded perspective view of a laminated band-pass filter according to a second preferred embodiment of the present invention.

A laminated band-pass filter according to a second preferred embodiment is described with reference to FIGS. 6 and 7. FIG. 6 is an exploded perspective view of the laminated band-pass filter according to the second preferred embodiment.

In FIG. 6, a ground electrode 209 is disposed on the upper surface of a ground electrode formation layer 201. Capacitor electrodes 211, 212, 213, and 214 are disposed in a capacitor electrode formation layer 202. Input/output electrodes 221 and 222 are disposed in an input/output electrode formation layer 203. Line electrodes 216 to 219 are disposed in a line electrode formation layer 204. An external layer 205 is disposed above the line electrode formation layer 204. The laminated band-pass filter defines a laminated structure preferably including five dielectric layers and four electrode layers and having terminal electrodes disposed on end surfaces.

The material of the dielectric layer portion of each layer is substantially the same as in the first preferred embodiment. The appearance of the laminated band-pass filter is substantially the same as that illustrated in FIG. 3.

In FIG. 6, the ground electrode 209 extending over an area slightly smaller than the plane external shape of the ground electrode formation layer 201 and ground connection electrodes 251 and 252 are disposed in the ground electrode formation layer 201. The ground connection electrodes 251 and 252 are electrically connected to the ground electrode 209 and extend to two side surfaces of the ground electrode formation layer 201. The two ground connection electrodes 251 and 252 are electrically connected to a ground terminal disposed on side surfaces of the laminated structure.

The four capacitor electrodes 211 to 214 disposed in the capacitor electrode formation layer 202 preferably are substantially rectangular and parallel to one another. A capacitance is formed between the ground electrode 209 and each of these capacitor electrodes 211 to 214. A capacitance is also formed between the neighboring capacitor electrodes.

The input/output electrodes 221 and 222 disposed in the input/output electrode formation layer 203 are in contact with the two shorter sides thereof and substantially rectangular. The two input/output electrodes 221 and 222 are electrically connected to input/output terminals of the laminated structure.

The line electrodes 216 to 219 disposed in the line electrode formation layer 204 are parallel or substantially parallel to one another and have a linear shape.

Via electrodes 231 to 238 are disposed in the input/output electrode formation layer 203, the capacitor electrode formation layer 202, the ground electrode formation layer 201, and the line electrode formation layer 204. The via electrodes 231 to 238 extend along the direction of the lamination of these layers. The via electrode 231 is electrically connected to a first end 216A of the line electrode 216, the capacitor electrode 211, and the input/output electrode 221. The via electrode 232 is electrically connected to a second end 216B of the line electrode 216 and the ground electrode 209. The via electrode 233 is electrically connected to a first end 217A of the line electrode 217 and the ground electrode 209. The via electrode 234 is electrically connected to a second end 217B of the line electrode 217 and the capacitor electrode 212. The via electrode 235 is electrically connected to a first end 218A of the line electrode 218 and the capacitor electrode 213. The via electrode 236 is electrically connected to a second end 218B of the line electrode 218 and the ground electrode 209. The via electrode 237 is electrically connected to a first end 219A of the line electrode 219 and the ground electrode 209. The via electrode 238 is electrically connected to a second end 219B of the line electrode 219, the capacitor electrode 214, and the input/output electrode 222.

Accordingly, the inductor electrodes formed by the via electrodes and line electrodes and the directions of the loops thereof have a relationship described below.

TABLE 2

| Inductor Electrode | Via Electrode | Line electrode | Loop Direction |
|---|---|---|---|
| First | 231, 232 | 216 | 1 |
| Second | 233, 234 | 217 | 0 |
| Third | 235, 236 | 218 | 1 |
| Fourth | 237, 238 | 219 | 0 |

A "loop" defined by an inductor electrode is formed by a path of the inductor electrode starting from a connection between a capacitor electrode and the inductor electrode, as in the case of the first preferred embodiment. That is, a loop starts from a connection between a capacitor electrode and a via electrode and is defined by a connection path of the via electrode, a line electrode, and another via electrode.

Unlike the first preferred embodiment, in the example illustrated in FIG. 6, the four capacitor electrodes 211 to 214 are disposed in the single layer 202, and a capacitance is formed between neighboring capacitor electrodes.

Figure 7:
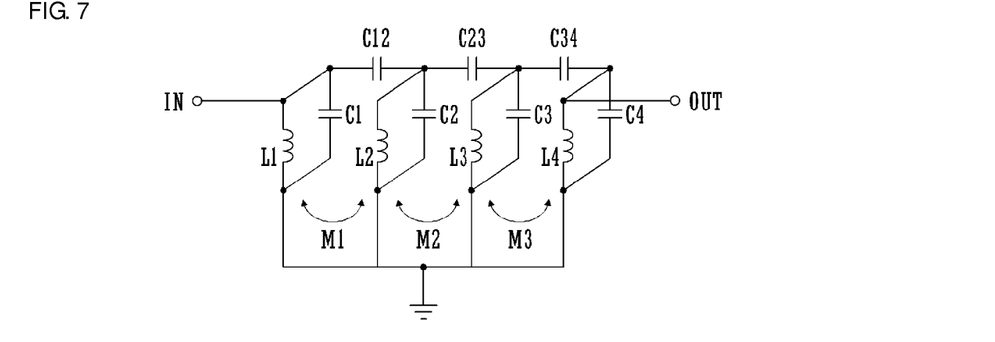
FIG. 7 is an equivalent circuit diagram of the laminated band-pass filter.

FIG. 7 is an equivalent circuit diagram of the above-described laminated band-pass filter.

In FIG. 7, an inductor L1 is defined by an inductance produced by the inductor electrode made up of the via electrodes 231 and 232 and the line electrode 216. An inductor L2 is defined by an inductance produced by the inductor electrode made up of the via electrodes 233 and 234 and the line electrode 217. Similarly, an inductor L3 is defined by an inductance produced by the inductor electrode made up of the via electrodes 235 and 236 and the line electrode 218. An inductor L4 is defined by an inductance produced by the inductor electrode made up of the via electrodes 237 and 238 and the line electrode 219.

Capacitors C1 to C4 are defined by capacitances formed between the capacitor electrodes 211 to 214 and the ground electrode 209. A capacitor C12 is defined by a parasitic capacitance formed between the capacitor electrodes 211 and 212. A capacitor C23 is defined by a parasitic capacitance formed between the capacitor electrodes 212 and 213. A capacitor C34 is defined by a parasitic capacitance formed between the capacitor electrodes 213 and 214.

When viewed from the direction of the arrangement of the inductor electrodes, the loop surfaces defined by the inductor electrodes each made up of two via electrodes and one line electrode overlap each other at least partially. Thus, at least inductors defined by neighboring inductor electrodes are inductively coupled to each other.

In FIG. 7, M1 represents an inductive coupling defined by the inductors L1 and L2, M2 represents an inductive coupling defined by the inductors L2 and L3, and M3 represents an inductive coupling defined by the inductors L3 and L4.

With the second preferred embodiment, substantially the same advantages as in the first preferred embodiment are obtainable. Obtainable advantages different from the first preferred embodiment and unique to the second preferred embodiment are described below. There is no need to have a capacitor for coupling input and output to achieve a sufficient amount of lower-band attenuation, the ground electrode 209 can have a flat-type electrode structure, and the capacitor electrodes 211 to 214 can be disposed in the same layer. Accordingly, capacitance formed by a shift in laminating and variations in parasitic capacitance between the capacitor electrodes can be prevented, and non-uniformity of electric characteristics are reduced structurally.

The line electrodes 216 to 219, the capacitor electrodes 211 to 214, and the ground electrode 209 are connected with the via electrodes 231 to 238, and the input/output electrodes 221 and 222, which connect to the input/output terminals, are arranged between the line electrode formation layer 204 and the capacitor electrode formation layer 202. This configuration enables the LC parallel resonators to be constructed using a closed loop and achieves the band-pass filter while maintaining high Q resonator characteristics.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A laminated band-pass filter comprising:
    a laminated structure including a plurality of dielectric layers and a plurality of electrode layers, the plurality of electrode layers each having a capacitor electrode and/or an inductor electrode disposed thereon, the capacitor electrodes and the inductor electrodes being arranged to define an even number of LC parallel resonators including neighboring LC parallel resonators of the even number of LC parallel resonators being coupled; and
    an input electrode connected to an input-side LC parallel resonator of the even number of LC parallel resonators and an output electrode connected to an output-side LC parallel resonator of the even number of LC parallel resonators; wherein
    the inductor electrode of each of the even number of LC parallel resonators defines a loop starting from a connection between a first end of the inductor electrode and the capacitor electrode;
    when viewed in a direction in which the inductor electrodes are arranged, surfaces of the loops defined by the inductor electrodes of the neighboring LC parallel resonators of the even number of LC parallel resonators overlap each other at least partially;
    when viewed in the direction in which the inductor electrodes are arranged, the loops defined by the inductor electrodes of at least two of the coupling LC parallel resonators have opposite directions; and
    the capacitor electrodes of the even number of LC parallel resonators have a shape and distribution having point symmetry in plan view.

2. The laminated band-pass filter according to claim 1, wherein the capacitor electrodes, the inductor electrodes, the input electrode, and the output electrode have a shape and distribution having point symmetry in plan view.

3. The laminated band-pass filter according to claim 1, wherein the loops defined by the inductor electrodes of the neighboring LC parallel resonators of the even number of LC parallel resonators have opposite directions.

4. The laminated band-pass filter according to claim 1, wherein each of the inductor electrodes is coiled and includes a via electrode disposed in a direction in which the dielectric layers are laminated and a line electrode at least disposed along a direction perpendicular or substantially perpendicular to the direction in which the dielectric layers are laminated, the inductor electrodes and the capacitor electrodes are arranged in a direction perpendicular or substantially perpendicular to the direction in which the dielectric layers and the electrode layers are laminated.

5. The laminated band-pass filter according to claim 4, wherein each of the capacitor electrodes forms a capacitance between the capacitor electrode and a common ground electrode extending over an area where the capacitor electrodes are arranged, and the capacitor electrodes are disposed in the same electrode layer.

6. The laminated band-pass filter according to claim 4, wherein each of the capacitor electrodes forms a capacitance between the capacitor electrode and a common ground electrode extending over an area where the capacitor electrodes are arranged, and the capacitor electrodes sandwich the ground electrode in a thickness direction and are disposed on opposite sides of the ground electrode.

* * * * *